US010034398B2

(12) United States Patent
Kurian et al.

(10) Patent No.: US 10,034,398 B2
(45) Date of Patent: Jul. 24, 2018

(54) DOCKING STATION WITH ROTATABLE MULTI-PLUG CONNECTOR (71) Applicant: Hewlett-Packard Development Company, L.P., Houston, TX (US)

(72) Inventors: Ligy Kurian, Houston, TX (US); Terrell Wade Aubert, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/326,198

(22) PCT Filed: Jul. 28, 2014

(86) PCT No.: PCT/US2014/048364
§ 371 (c)(1),
(2) Date: Jan. 13, 2017

(87) PCT Pub. No.: WO2016/018205
PCT Pub. Date: Feb. 4, 2016

(65) Prior Publication Data
US 2017/0208697 A1 Jul. 20, 2017

(51) Int. Cl.
H05K 7/02 (2006.01)
H05K 7/04 (2006.01)
(Continued)

(52) U.S. Cl.
CPC .......... H05K 5/0217 (2013.01); H01R 27/00 (2013.01); H02J 7/0044 (2013.01); H02J 2007/0062 (2013.01)

(58) Field of Classification Search
CPC ............ H05K 5/0217; H02J 2007/0062; H02J 7/0044; H01R 27/00
(Continued)

(56) References Cited

U.S. PATENT DOCUMENTS 6,142,593 A * 11/2000 Kim .................. G06F 1/1632
312/223.2
7,933,117 B2 4/2011 Howarth et al.
(Continued)

FOREIGN PATENT DOCUMENTS

| JP | 2011018618 A | 1/2011 |
| KR | 10-20090058613 A | 6/2009 |
| KR | 10-20100094708 A | 8/2010 |

OTHER PUBLICATIONS

"Quirky Converge Universal USB Docking Station"; Sep. 28, 2012; 3 pages http://in.mobilefun.com/36199-quirky-converge-universal-usb-docking-station.htm.

Primary Examiner — Hung S Bui
(74) Attorney, Agent, or Firm — HP Inc. Patent Department (57) ABSTRACT In one example, a docking station includes a base and a rotatable multi-plug connector to electrically plug into the electronic device. The multi-plug connector includes a first plug to plug into a first type of electronic device port and a second plug to plug into a second type of electronic device port. The multi-plug connector can be rotated between a first position in which the first plug is oriented to plug into the electronic device and a second position in which the second plug is oriented to plug into the electronic device.

15 Claims, 9 Drawing Sheets (51) Int. Cl.
*H05K 5/02* (2006.01)
*H02J 7/00* (2006.01)
*H01R 27/00* (2006.01)

(58) Field of Classification Search
USPC .................................................. 361/809, 810
See application file for complete search history.

(56) References Cited

U.S. PATENT DOCUMENTS

| | | |
|---|---|---|
| 8,223,483 B2 | 7/2012 | Hayashida et al. |
| 9,436,221 B2 * | 9/2016 | Raghunathan ........ G06F 1/1632 |
| 2006/0258224 A1 * | 11/2006 | Liao ....................... H01R 13/72 439/638 |
| 2007/0035917 A1 * | 2/2007 | Hotelling ............... G06F 1/1632 361/679.56 |
| 2009/0063733 A1 * | 3/2009 | Huang ................... H01R 27/00 710/38 |
| 2012/0014056 A1 | 1/2012 | Chen et al. |
| 2012/0147574 A1 * | 6/2012 | Yang ...................... H01R 27/00 361/755 |
| 2013/0005179 A1 | 1/2013 | Aldana et al. |
| 2013/0058036 A1 * | 3/2013 | Holzer ................... G06F 1/1632 361/679.44 |
| 2013/0205060 A1 | 8/2013 | Benhard et al. |
| 2014/0006669 A1 | 1/2014 | Klein et al. |
| 2015/0024625 A1 * | 1/2015 | Hsieh ..................... H01R 33/90 439/540.1 |
| 2016/0320801 A1 * | 11/2016 | Buss ..................... G06F 1/1632 |

\* cited by examiner

Secure a multi-plugged connector to a base of a docking station such that the connector can securely rotate between:

(a) a first secured position in which a first plug is oriented to plug into a first type of electronic device port while a second plug is oriented so as not to plug into the electronic device, and (b) a second secured position in which a second plug is oriented to plug into a second type of electronic device port while the first plug is oriented so as not to plug into the electronic device.

114

Electrically couple the connector to a cable so as to allow the cable to be electrically coupled to the electronic device when the electronic device is plugged into the connector.

FIG. 12

DOCKING STATION WITH ROTATABLE MULTI-PLUG CONNECTOR

CROSS-REFERENCE TO RELATED APPLICATION

This application is a U.S. National Stage Application of and claims priority to International Patent Application No. PCT/US2014/048364, filed on Jul. 28, 2014, and entitled "DOCKING STATION WITH ROTATABLE MULTI-PLUG CONNECTOR," which is hereby incorporated by reference in its entirety.

BACKGROUND

Docking stations are often designed to simplify the process of plugging in an electronic device to a charger or other electrical plug. For example, a docking station to accommodate a mobile phone may include a charging plug, such as a Micro USB plug, that extends upward from the docking station and is electrically connected to a power supply via a wall socket. To use the docking station, a user plugs the mobile phone into the plug, thereby allowing the mobile phone to be charged via the power supply.

BRIEF DESCRIPTION OF THE DRAWINGS

For a detailed description of various examples, reference will now be made to the accompanying drawings in which.

NOTATION AND NOMENCLATURE

In the following discussion and in the claims, the terms "including" and "comprising" are used in an open-ended fashion, and thus should be interpreted to mean "including, but not limited to . . . ." Also, the term "couple" or "couples" is intended to include suitable indirect and/or direct connections. Thus, if a first component is described as being coupled to a second component, that coupling may, for example, be: (1) through a direct electrical or mechanical connection, (2) through an indirect electrical or mechanical connection via other devices and connections, (3) through an optical electrical connection, (4) through a wireless electrical connection, and/or (5) another suitable coupling. The term "approximately" as used herein to modify a value is intended to be determined based on the understanding of one of ordinary skill in the art, and can, for example, mean plus or minus 10% of that value.

DETAILED DESCRIPTION

The following discussion is directed to various examples of the disclosure. Although one or more of these examples may be preferred, the examples disclosed should not be interpreted, or otherwise used, as limiting the scope of the disclosure, including the claims. In addition, one skilled in the art will understand that the following description has broad application, and the discussion of any example is meant only to be descriptive of that example, and not intended to intimate that the scope of the disclosure, including the claims, is limited to that example.

Docking stations are often designed to accommodate either a single model of electronic device (e.g., a specific tablet model) or a range of electronic devices all having the same port type and location (e.g., tablets with Micro USB ports located on a side surface of the tablet). The specific model or port type and location will often dictate the docking station's plug type and location. For example, an electronic device in the form of a 10-inch tablet with a Micro USB port located on the bottom of the device midway between the sides of the tablet can fit in a suitably sized docking station with a Micro USB plug in a corresponding position. As a result, different docking stations may be needed for different electronic devices. Moreover, some electronic devices can include a first type of port (e.g., a Micro-USB port for charging the device) on a first side (e.g., a bottom of the device) and a second type of port (e.g., an HDMI port for transferring multimedia data) on a second side (e.g., a left side of the device). As a result, when the device is rotated from a first orientation (e.g., a portrait orientation) to a second orientation (e.g., a landscape orientation), a docking station with a fixed plug type and location may not be able to accommodate the electronic device in both positions.

Several examples of solutions that address these issues are described herein. One implementation of such a solution is in the form of a universal docking station that includes a rotatable connector with multiple plugs. The rotatable connector can, for example, be rotated like a wheel and secured in a position suitable for plugging into an electronic device. The docking station can further include various structural features that allow the docking station to accommodate different types and sizes of electronic devices. For example, in some implementations, the rotatable connector can slide sideways to position the connector to align with a port of the electronic device. In some implementations, the docking station can include one or more alignment arms that are retractable to accommodate various sizes of electronic devices. In some implementations, one or more elements of the docking station can be tilted backward at a desired angle to use the electronic device while it is in the docking station.

Figure 1:
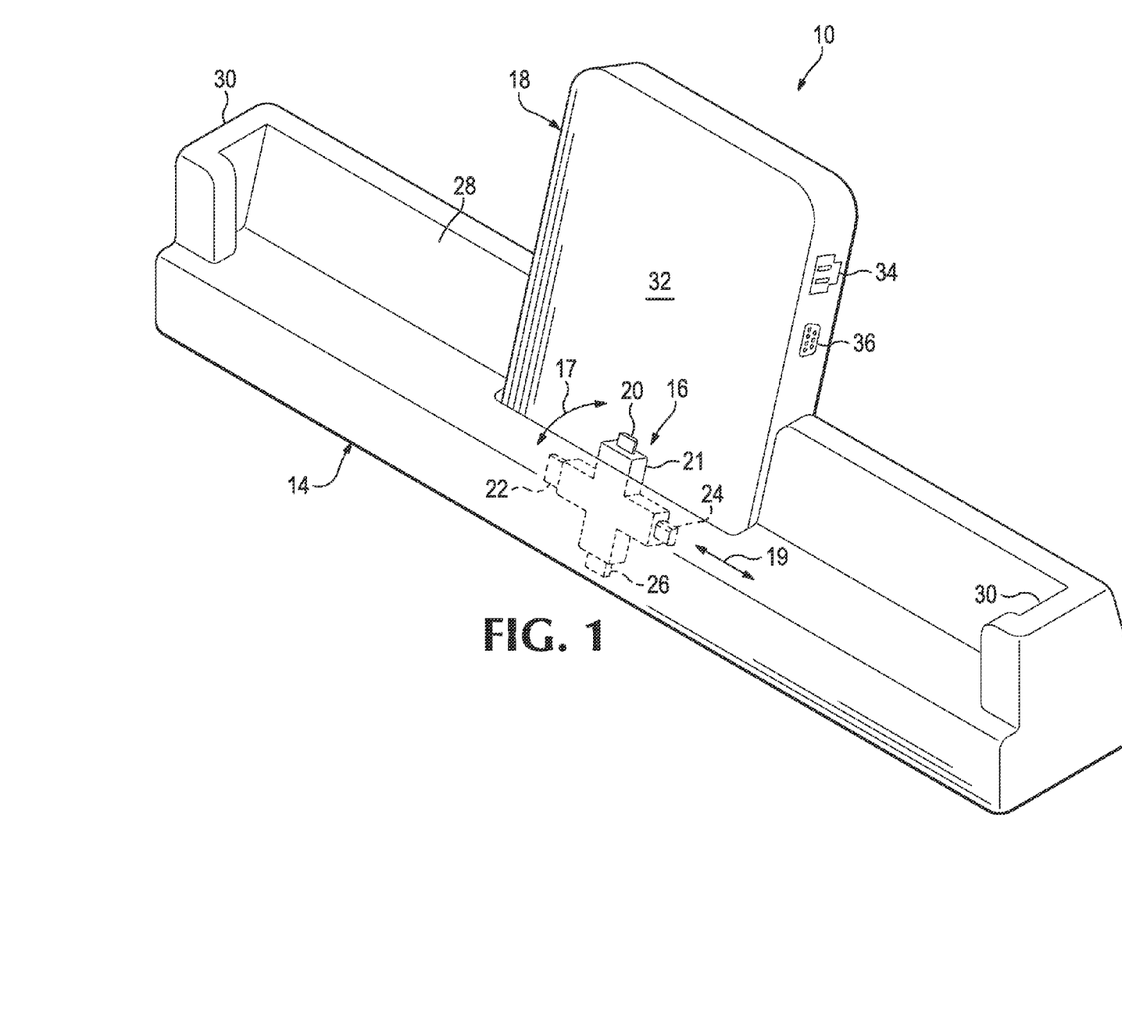
FIG. 1 is a schematic front perspective view of a docking station, according to an example.
Figure 2:
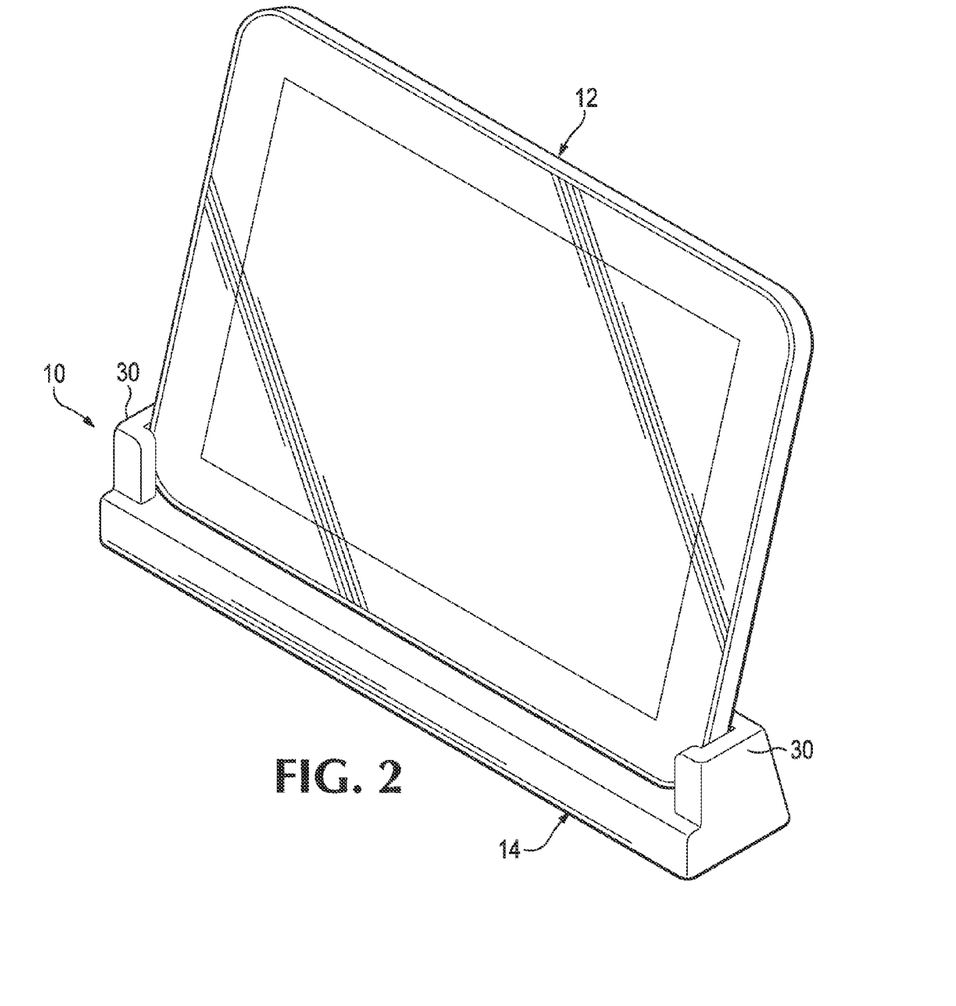
FIG. 2 is a front perspective view of the docking station of FIG. 1 with an electronic device plugged into the docking station.
Figure 3:
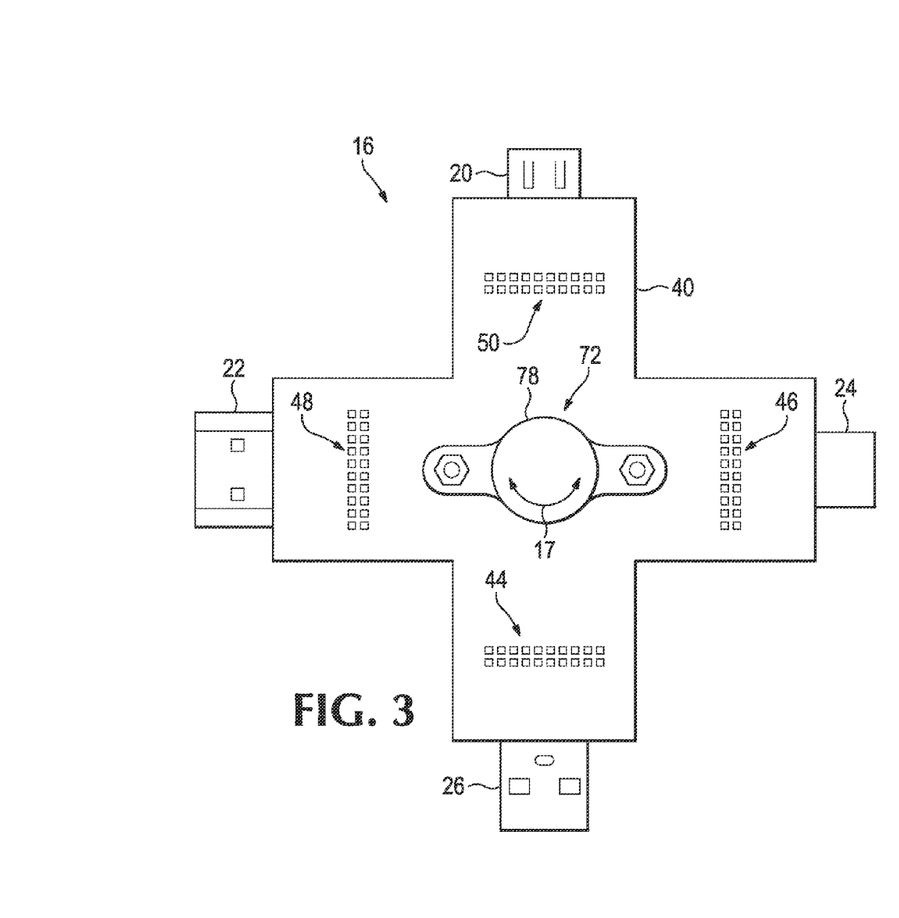
FIG. 3 is a schematic front view of a connector for the docking station of FIG. 1 in a first secured position, according to an example.

FIGS. 1 and 2 illustrate a schematic of a docking station 10 according to an example. In particular, FIG. 1 illustrates a front perspective view of docking station 10 and FIG. 2 illustrates a front perspective view of docking station 10 with an electronic device 12 docked in docking station 10. Docking station 10 includes a base 14 to support electronic device 12, a multi-plug connector 16 to electrically plug into the electronic device, and a backstop 18 to support electronic device 12. As described further herein, FIG. 1 depicts three plugs 20, 22, and 24 extending from connector 16. A fourth plug 26 (which is shown in FIG. 3) also extends from connector 16, but is obscured by base 14 in FIG. 1. The four plugs of connector 16 extend from a housing 21 of connector 16 in four directions and each plug is designed to plug into a different type of port of one or more electronic devices.

Figure 5:
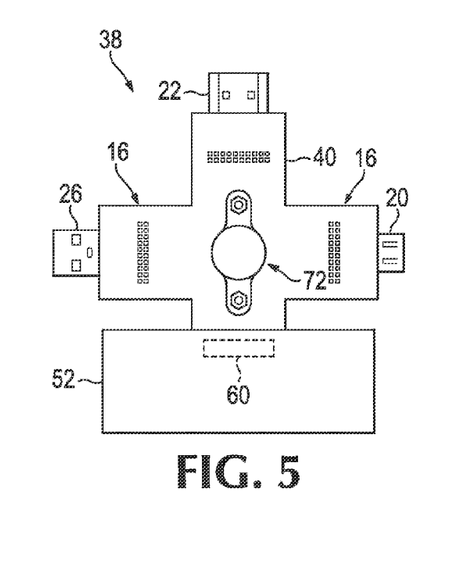
FIG. 5 is a schematic front view of the connector assembly of FIG. 4 in a second secured position.
Figure 6:
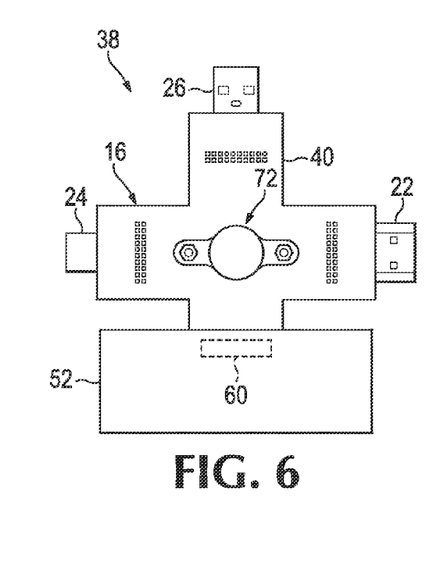
FIG. 6 is a schematic front view of the connector assembly of FIG. 4 in a third secured position.
Figure 7:
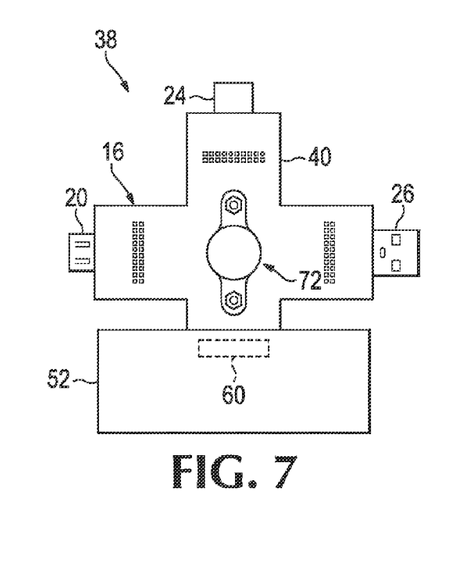
FIG. 7 is a schematic front view of the connector assembly of FIG. 4 in a fourth secured position.

Connector 16 is rotatably secured to base 14 so as to allow connector 16 to rotate along rotational direction 17 around a rotational axis between a first secured position (shown, for example, in FIG. 1) and three other secured positions (shown, for example, in FIGS. 5-7). As described further herein, in the first secured position, first plug 20 is oriented to plug into electronic device 12 while the other plugs 22, 24, and 26 are oriented so as not to plug into electronic device 12. As described further herein, the three other secured positions correspond to respective positions at which second, third, and fourth plugs 22, 24, and 26 are oriented to plug into electronic device 12, while the other plugs are oriented so as not to plug into electronic device 12.

In some implementations, connector 16 can provide power to charge an electronic device (e.g., electronic device 12) plugged into connector 16. The power can, for example, be provided in the form of an alternating or direct electrical current. Additionally or in the alternative, connector 16 can be used to allow data communication between electronic device 12 and another device via connector 16. Data communication can, for example, be in the form of analog signals (e.g., certain VGA connectors) or digital signals (e.g., certain HDMI connectors). It is appreciated that in some implementations, a single plug (such as a Micro-USB plug) can be used to both charge electronic device 12 and allow data communication with electronic device 12.

Connector 16 can be slidably secured to base 14 so as to allow connector 16 to securely slide relative to base 14 along sliding direction 19. For example, connector 16 can be slid to a "middle" position midway between two sides of the docking station 10 when a corresponding port of electronic device 12 is positioned midway between two sides of electronic device 12. Similarly, connector 16 can be slid towards a left end of docking station 10 when a corresponding port of electronic device 12 is positioned towards the left end of the device. In some implementations, connector 16 can slide along a track formed in base 14 or another component of the docking station (e.g., bottom support 98 of docking station 84) to provide for such sliding movement. Other structures for allowing connector 16 to accommodate ports in different locations on electronic device 12 can be provided in accordance with the disclosure herein. For example, as described further below, docking station 10 can include one or more independently retractable alignment arms that can position electronic device 12 such that its port aligns with connector 16 in lieu of aligning connector 16 to align with the port of electronic device 12. It is appreciated that in some implementations, a docking station can include a combination of alignment arms (or other such structures) and a slidable connector in order to accommodate various electronic devices.

Certain implementations of connector 16 can include plugs that are radially symmetrical with respect to a rotational axis of connector 16. For example, as depicted in FIG. 3, connector 16 includes four distinct plugs corresponding to four directions that are approximately 90 degrees apart (e.g., up, down, left, and right). However, it is appreciated any suitable number of plugs can be used. For example, in some implementations, connector 16 can include less than four plugs or greater than four plugs. Moreover, the plugs of connector 16 can be arranged in any suitable orientation. In particular, first plug 20 is shown as extending in a direction from connector 16 that is approximately 90 degrees from the direction that second plug 22 extends from connector 16. However, in some implementations, first plug 20 extends at another angle from second plug 22, such as approximately 120 or 180 degrees. In some implementations including a two-plug connector, the connector includes a first plug that faces upwards while a second plug faces downward. In other implementations of a two-plug connector, the connector includes a first plug that faces leftward while a second plug faces downward. The type of plugs for use with connector 16 can be selected from any suitable type of electrical plug. For example, one or more plugs of connector 16 can be in the form of VGA, HDMI, RJ-45, USB, Mini DisplayPort, Micro USB, Apple® 30-pin dock connector, Apple® Lightning connector, or the like. As described herein, the plugs can, for example, be used to power electronic device 12 and/or allow data communication between electronic device 12 and another electronic device.

As described above, docking station 10 includes a base 14. Base 14 can be designed to rest on a support surface such as a table or desk and to securely support the electronic device above the surface. Base 14 can be designed for use in other suitable environments. For example, base 14 can be designed for use in a vehicle, such as an automobile, by securing base 14 to a windshield using a suction cup mount.

In some implementations, base 14 does not include any electrical components. For example, connector 16 can be rotatably coupled to base 14, but the electrical components can be included in a wire or other structure that is separate from and does not pass through base 14. In other implementations, such as those described below with respect to FIGS. 3-7, base 14 can house electronic components to allow connector 16 to be electronically connected to a power supply or other source via base 14.

Base 14 can include various structural features for aligning, positioning, and securing electronic device 12 docked in docking station 10. For example, base 14 can include a back wall 28 and one or more side walls 30 for aligning and securing electronic device 12 in docking station 10. Docking station 10 can further include a backstop 18. Backstop 18 can include a back support surface 32 to support a back surface of electronic device 12 when electronic device 12 is plugged into connector 16. Backstop 18 can, for example, be adjustable between different "tilt" positions so as to allow electronic device 12 to be tilted at a desired angle for viewing or otherwise operating electronic device 12.

In some implementations, backstop 18 can include electrical circuitry and can, for example, include one or more ports (e.g., ports 34 and 36 as shown in FIG. 1). Such ports can, for example, be electrically connected to connector 16, another device, or a power supply. For example, in some implementations, port 34 can be designed to transmit electrical power from a wall socket to charge the electronic device via a first plug of connector 16, whereas port 36 can be designed to carry data to communicate with the electronic device via a second plug of connector 16. In some implementations, backstop 18 does not include any such electrical components and can merely be used to support the electronic device at a desired tilt angle or another function.

As described above, electronic device 12 can, for example, be in the form of a tablet. It is appreciated that other suitable electronic devices can be used with docking station 10. For example, docking station 10 can be designed to accommodate other suitable mobile devices, such as mobile phones, laptops, etc. In some implementations, docking station 10 can be designed to accommodate electronic devices in the form of computer peripherals or accessories, such as headsets, wireless keyboards and/or mouses, etc. It is appreciated that aspects of the disclosure can be implemented in a docking station that accommodates multiple electronic devices docked together as well as a single electronic device with multiple ports. For example, such a docking station can include a first rotatable connector to plug into a first electronic device and a second rotatable connector to plug into a second electronic device (or a second port on the first electronic device). In such a docking station, the first rotatable connector can, for example, be positioned on a left side of the docking station, whereas the second rotatable connector can for example, be positioned on a right end of the docking station.

Figure 4:
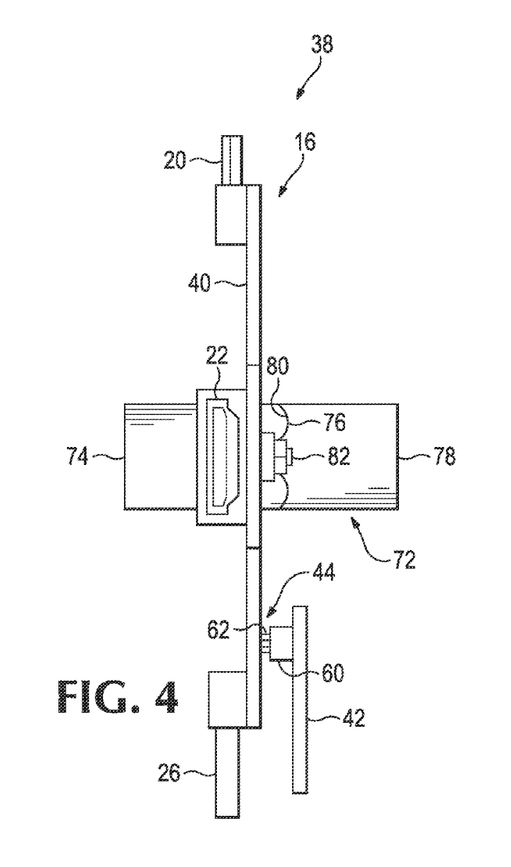
FIG. 4 is a schematic right side view of a connector assembly including the connector of FIG. 3.

FIGS. 3-7 illustrate schematic views of connector 16 and connector assembly 38 with their respective housings removed in order to illustrate electrical aspects of these components. In particular, FIG. 3 is a schematic front view of connector 16 in a first secured rotational position, FIG. 4 is a schematic right side view of connector assembly 38 including connector 16 in the first secured rotational position, FIG. 5 is a schematic front view of connector assembly 38 in a second secured rotational position, FIG. 6 is a schematic front view of connector assembly 38 in a third secured rotational position, and FIG. 7 is a schematic front view of connector assembly 38 in a fourth secured rotational position.

Connector assembly 38 includes elements of connector 16 and base 14 and is designed to provide an electrical connection between connector 16 and base 14. For example, as described above, connector assembly 38 includes a connector circuit board 40 and a base circuit board 42. Connector circuit board 40 includes contacts 44, 46, 48, and 50 corresponding to each plug 20, 22, 24, and 26.

Each contact can be coupled to its respective plug through an electrical pathway, such as a circuit on circuit board 40, a standalone wire, or another suitable connector. Due to the geometry of connector 16 and base 14, first contact 44 is located on an opposite end of connector 16 from first plug 20, however it is appreciated that other arrangements can be used. For example, first contact 44 can be positioned on a right side of connector 16 and first plug 20 can be positioned at the top of connector 16. In some implementations, first contact 44 and first plug 20 are positioned in a same region (e.g., top, bottom, middle, left, right) of connector 16.

Base circuit board 42 is connected to a base contact unit 60 including a base contact 62 designed to electrically connect to a respective connector contact in a respective orientation of connector 16. Base contact 62 can, for example, be a POGO pin or another suitable electronic contact that allow reliable connection/disconnection between connector 16 and base 14. Although the various connector contacts (as well as the base contact) are referred to using the singular term "contact," it is appreciated that this term is intended to also refer to suitable contact arrays. For example, as illustrated in FIG. 3, each of the circuit board contacts (e.g., contacts 44, 46, 48, and 50 are actually in the form of twenty distinct contact surfaces aligned in two rows of ten. These twenty distinct contact surfaces can align with corresponding contact surfaces of base contact 62.

Connector 16 is rotatably secured to base 14 via rotation assembly 72 so as to allow rotation between the first, second, third, and fourth secured rotational positions. In the implementation of connector 16 and connector assembly 38 illustrated in FIGS. 3-7, contacts 44, 46, 48, and 50 of connector circuit board 40 are positioned on connector circuit board 40 such that they connect or disconnect from base contact 62 according to the rotational position of connector circuit board 40.

For example: (1) in a first rotational position, first contact 44 is moved to engage with base contact 62 to electrically connect first plug 20, thereby disengaging second, third, and fourth contacts 46, 48, and 50 from base contact 62 to electrically disconnect second, third, and fourth plugs 22, 24, and 26; (2) in a second rotational position, second contact 46 is moved to engage with base contact 62 to electrically connect second plug 66, thereby disengaging first, third, and fourth contacts 44, 48, and 50 from base contact 62 to electrically disconnect first, third, and fourth plugs 20, 24, and 26; (3) in a third rotational position, third contact 48 is moved to engage with base contact 62 to electrically connect third plug 68, thereby disengaging first, second, and fourth contacts 44, 46, and 50 from base contact 62 to electrically disconnect first, second, and fourth plugs 20, 22, and 26; and (4) in a fourth rotational position, fourth contact 50 is moved to engage with base contact 62 to electrically connect fourth plug 70, thereby disengaging first, second, and third contacts 44, 46, and 48 from base contact 62 to electrically disconnect first, second, and third plugs 20, 22, and 24.

The contacts of connector circuit board 40 can, for example, be electrically connected to base contact 62 through direct physical contact. For example, in implementations where one or more of the contacts of connector circuit board 40 and base contact 62 are exposed metal contacts, the contacts can be electrically connected by direct touching between the contacts. In certain implementations, contacts can be inductively coupled such that they are electrically connected without direct touching between the contacts. In some implementations, a first plug is designed to be electrically connected with base contact 62 via inductive coupling, whereas a second plug is designed to be electrically connected with base contact 62 via direct touching. Such an implementation can, for example, be used where a first plug is designed to charge the electronic device but not allow data communication with the electronic device, and a second plug is designed to allow data communication with the electronic device.

Any suitable electrical coupling or connection may be used between the various plugs 20, 22, 24, and 26 and base contact unit 60 such as, for example, electrical leads, electrical spring-loaded pogo pins with magnetic holding force, or some combination thereof. In this example, exposed electrical contacts disposed on base circuit board 42 engage with corresponding electrical pogo-pin leads of base contact unit 60 to transfer power or signals between connector 16 and base 14 during operation.

As described above, connector 16 is rotatably secured to base 14 so as to allow connector 16 to rotate between four secured positions. It is appreciated that for implementations including greater or fewer plugs, greater or fewer secured positions may be available. It is further appreciated that there can be greater or fewer secured positions then there are plugs. For example, in implementations where docking station 10 includes three plugs, docking station 10 can include four secured positions, with one of the secured positions electrically disconnecting the three plugs such that the electronic device can "dock" on docking station 10 without being plugged into any plug.

As illustrated in FIG. 4, certain implementations of rotation assembly 72 can include a first piece 74 with a cammed surface 76, a second piece 78 with a cammed surface 80 that corresponds to cammed surface 76, and a securing element 82 that allows secure rotation between first piece 74 and second piece 78. First piece 74 can, for example, be secured to connector circuit board 40 such that rotation of connector circuit board 40 will rotate first piece 74 as well. Second piece 78 can, for example, be secured to base 14 or another component of docking station 10 such that second piece 78 remains in place when first piece 74 is rotated, thereby allowing relative rotation between first piece 74 and second piece 78. One or more cammed surfaces between first piece 74 and second piece 78, such as cammed surfaces 76 and 80, can allow rotation assembly 72 to be secured in the various secured positions described above and illustrated, for example, in FIGS. 3-7. Securing element 82 can, for example, be in the form of a rigid fastener that allows relative rotation between first piece 74 and second piece 78. In some implementations, securing element 82 is in the form of a screw, bolt, nail, or the like.

Figure 8:
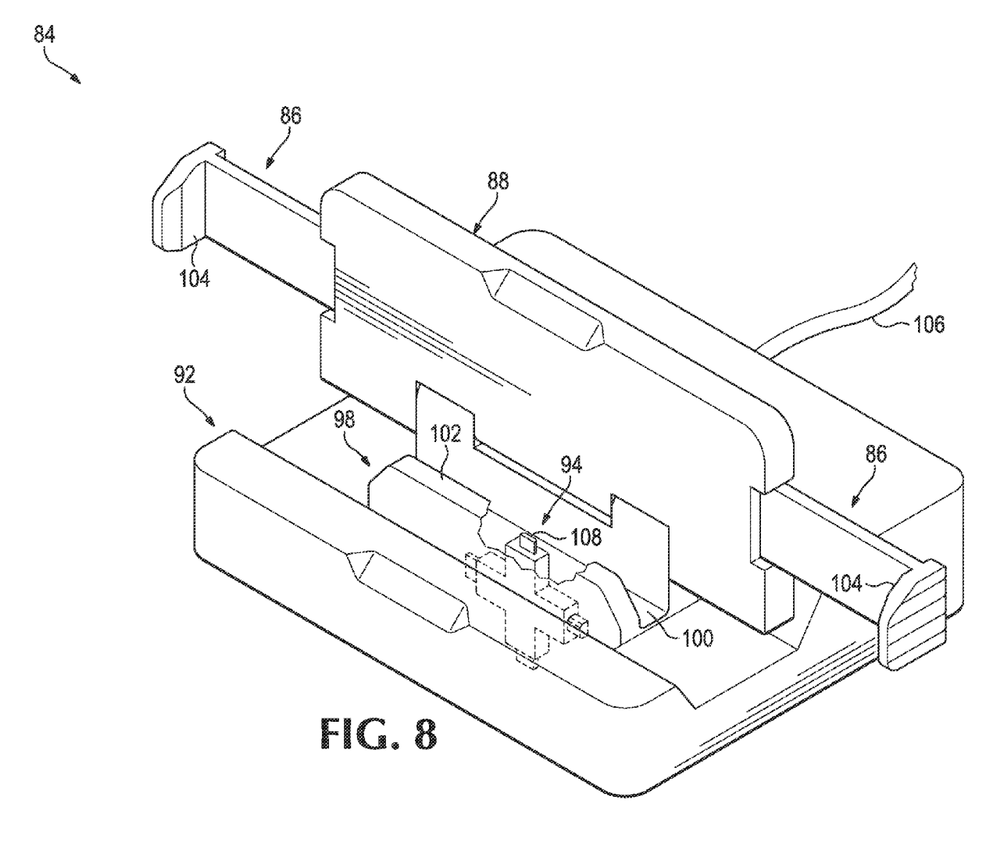
FIG. 8 is a front perspective view of a docking station, according to another example.
Figure 9:
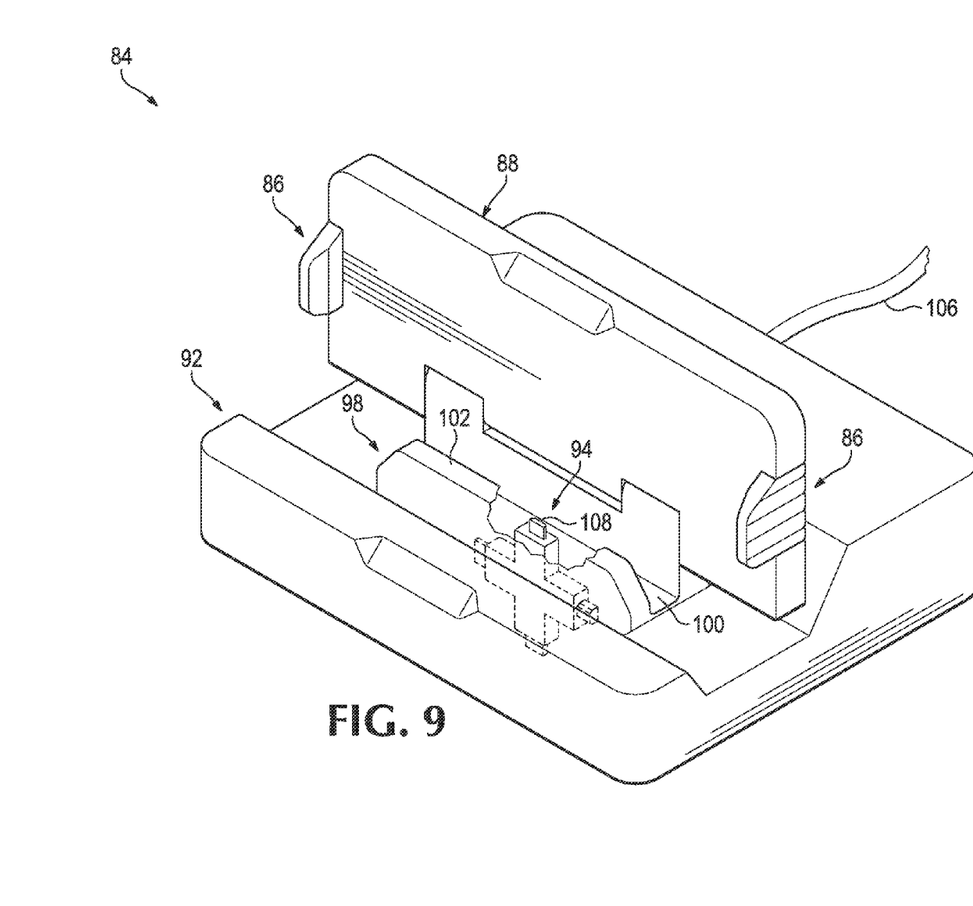
FIG. 9 is a front perspective view of the docking station of FIG. 8 with alignment arms of the docking station in a retracted position.
Figure 10:
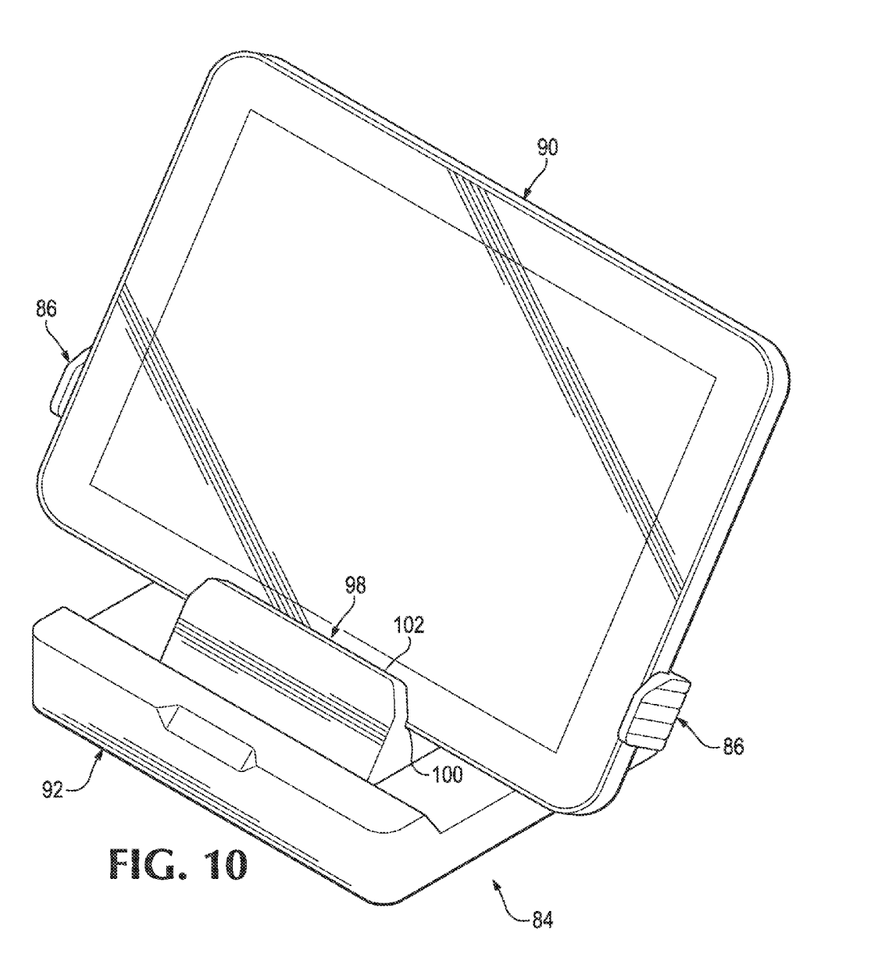
FIG. 10 is a front perspective view of the docking station of FIG. 8 with a backstop of the docking station in a tilted position and with an electronic device plugged into the docking station.
Figure 11:
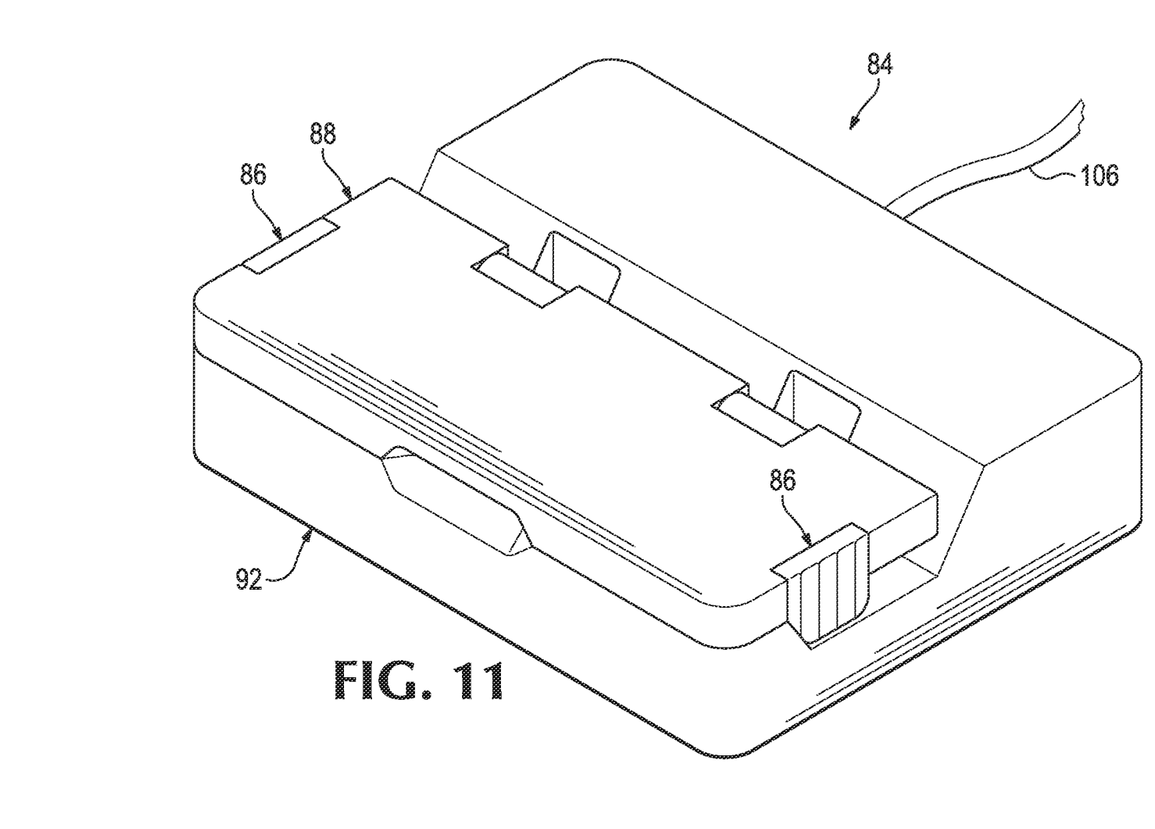
FIG. 11 is a front perspective view of the docking station of FIG. 8 with the backstop in a closed position.

FIGS. 8-11 illustrate another example of a docking station 84. In particular, FIG. 8 is a front perspective view of docking station 84; FIG. 9 is a front perspective view of docking station 84 with a set of alignment arms 86 in a retracted position; FIG. 10 is a front perspective view of docking station 84 with a backstop 88 in a tilted position and with an electronic device 90 plugged into docking station 84; and FIG. 11 is a front perspective view of docking station 84 with backstop 88 in a closed position.

Docking station 84 includes a base 92 to support electronic device 90 (which is shown, for example, in FIG. 10), a multi-plug connector 94 to electrically plug into electronic device 90, a cable 106 connected to connector 94, backstop 88 to support electronic device 90 within docking station 84, a bottom support 98 to support electronic device 90 above base 92, and alignment arms 86 to align electronic device 90 relative to connector 94. It is appreciated that one or more structural or functional aspects of docking station 84 can be implemented in docking station 84 or vice versa. For example, one or more components of docking station 84 (e.g., connector 94, base 92, backstop 88, electronic device 90, etc.), can incorporate one or more structural or functional aspects of corresponding components of docking station 10 described above with respect to FIG. 1 and vice versa. Additionally, docking station 10 can include one or more components from docking station 84 and vice versa (e.g., docking station 10 can include alignment arms 86, cable 106, etc.).

Backstop 88 can be rotatably connected to base 92 to allow docking station 84 to be rotated backwards to allow electronic device 90 to be tilted backwards (see, e.g., FIG. 10) or rotated forward to place docking station 84 in a closed position (see, e.g., FIG. 11). Bottom support 98 can be used to support a bottom of electronic device 90 while allowing electronic device 90 to plug into connector 94 when electronic device 90 is placed in docking station 84. For example, in some implementations, bottom support 98 includes an opening through which connector 94 is positioned.

In some implementations, bottom support 98 includes a bottom support surface 100 upon which electronic device 90 rests to support electronic device 90 above base 92. Bottom support 98 can further include a lip 102 that is raised above bottom support surface 100 and can, for example, be used as a stop to prevent forward movement of the bottom of electronic device 90. Lip 102 can, in some implementations, be used to obscure at least a portion of connector 94 for aesthetics or other purposes.

As described above, docking station 84 includes a set of alignment arms 86 to align electronic device 90 relative to connector 94. In some implementations, docking station 84 includes only a single alignment arm 86. Each alignment arm 86 includes a side surface 104 designed to position or grip electronic device 90 to secure electronic device 90 within docking station 84. As illustrated in FIGS. 8 and 9, alignment arms 86 can, for example, be retractable to accommodate different size electronic devices 90. In some implementations, each alignment arm 86 can be independently retractable or fixed. For example, a first alignment arm can be fixed at a single position, whereas a second alignment arm can be retractable. Alignment arms 86 can be secured in one or more desired retracted or expanded positions through the use of detents or other mechanical retaining structures. Although two alignment arms are illustrated in FIGS. 8-11, it is appreciated that any suitable number of alignment arms can be included in docking station 84.

As described above, docking station 84 can include a cable 106 electrically connected to connector 94. Cable 106 can, for example, be electrically coupled to connector 94 such that cable 106 is electrically coupled to electronic device 90 when electronic device 90 is plugged into connector 94. In some implementations, cable 106 can be electrically coupled to base 92 by way of one or more intermediary components between cable 106 and connector 94. For example, cable 106 can be plugged into a port of base 92, with a second cable internal to base 92 being connected to the port of base 92 at a first end and connected to connector 94 at a second end.

Cable 106 can be connected to base 92 to power or pass data between cable 106 and electronic device 90 plugged into connector 94 through a plug 108 of connector 94. For example, cable 106 can be connected to a power source, such as a wall socket, to charge electronic device 90. In implementations where connector 94 passes data between electronic device 90 and another device, cable 106 can, for example, be in the form of a data cable, such as a USB cable.

Figure 12:
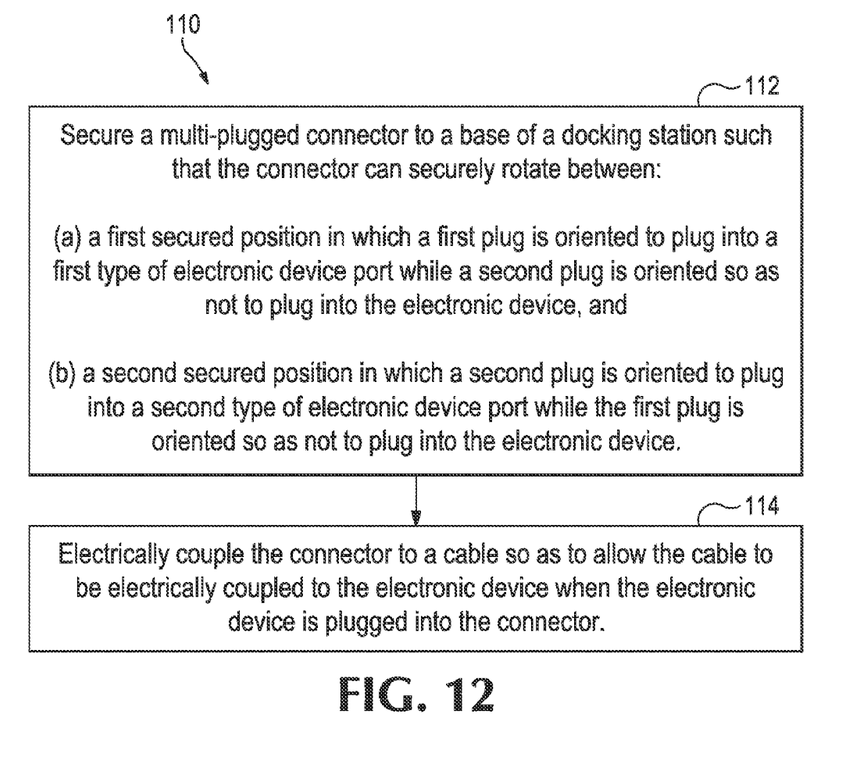
FIG. 12 is a flowchart for a method of assembling a docking station with a rotatable multi-plug connector, according to an example.

FIG. 12 is a flowchart for a method 110 related to the use of a docking station with a rotatable multi-plug connector. The descriptions of method 110 refer to elements of docking station 10 and 84 and connector assembly 38 for illustration, however, it is appreciated that this method can be used for any suitable docking station or connector assembly described herein or otherwise. Moreover, although the flowchart of FIG. 12 shows a specific order of performance, this order may be rearranged into another suitable order, may be executed concurrently or with partial concurrence, or a combination thereof. Likewise, suitable additional and/or comparable steps may be added to method 110 to achieve the same or comparable functionality.

Method 110 includes a step 112 of securing multi-plug connector 16 to base 14 such that connector 16 can securely rotate between: (1) a first secured position (an example of which is shown in FIG. 3) in which first plug 20 is oriented to plug into electronic device 12 while second plug 22 is oriented so as not to plug into electronic device 12, and (2) a second secured position (an example of which is shown in FIG. 5) in which second plug 22 is oriented to plug into electronic device 12 while first plug 20 is oriented so as not to plug into electronic device 12. Method 110 includes a step 114 of electrically coupling connector 94 to a cable (e.g., cable 106) so as to allow cable 106 to be electrically coupled to electronic device 12 when electronic device 12 is plugged into connector 16. Step 114 can be in the form of a direct connection (e.g., soldering a wire to connector 94 or to a base circuit board 42), a removable connection (e.g., plugging cable 106 into a port on base 92 that is electrically coupled to base circuit board 42), or another suitable connection.

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be understood that the systems, apparatuses, and methods described herein can include various combinations and/or sub-combinations of the components and/or features of the different implementations described. Thus, features described with reference to one or more implementations can be combined with other implementations described herein.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A docking station comprising:
    a base to support an electronic device docked in the docking station; and
    a multi-plug connector to electrically plug into the electronic device, the multi-plug connector including:
        a first plug extending from the multi-plug connector in a first direction, the first plug to plug into a first type of electronic device port; and
        a second plug extending from the multi-plug connector in a second direction, the second plug to plug into a second type of electronic device port,
    wherein the multi-plug connector is rotatably secured to the base so as to allow the multi-plug connector to rotate between:
        a first secured position in which the first plug is oriented to plug into the electronic device while the second plug is oriented so as not to plug into the electronic device, and
        a second secured position in which the second plug is oriented to plug into the electronic device while the first plug is oriented so as not to plug into the electronic device, and
    wherein in the first secured position, the first plug is electrically connected to the base and the second plug, is electrically disconnected from the base; and in the second secured position, the first plug is electrically disconnected from the base and the second plug is electrically connected to the base.

2. The docking station of claim 1, further comprising:
    a cable electrically coupled to the multi-plug connector such that the cable is electrically coupled to the electronic device when the electronic device is plugged into the multi-plug connector.

3. The docking station of claim 1, wherein the multi-plug connector is to provide power to the electronic device through the multi-plug connector when the electronic device is plugged into the multi-plug connector.

4. The docking station of claim 1, wherein the multi-plug connector is to allow data communication between the electronic device and the multi-plug connector when the electronic device is plugged into the multi-plug connector.

5. The docking station of claim 1, wherein the multi-plug connector is slidably secured to the base to allow the multi-plug connector to slide relative to the base.

6. The docking station of claim 1, further comprising:
    a backstop to support the electronic device at an angle when the electronic device is plugged into the multi-plug connector.

7. The docking station of claim 1,
    wherein the multi-plug connector includes a third plug extending from the multi-plug connector in a third direction, the third plug to plug into a third type of port for an electronic device, and
    wherein the multi-plug connector is rotatably secured to the base so as to allow the multi-plug connector to rotate between:
        a first secured position in which the first plug is oriented to plug into the electronic device while the second and third plugs are oriented so as not to plug into the electronic device,
        a second secured position in which the second plug is oriented to plug into the electronic device while the first and third plugs are oriented so as not to plug into the electronic device, and
        a third secured position in which the third plug is oriented to plug into the electronic device while the first and second plugs are oriented so as not to plug into the electronic device.

8. The docking station of claim 1, wherein the first plug is a VGA, HIM, RJ-45, USB, Mini DisplayPort, or Micro USB plug.

9. The docking station of claim 1, wherein the first plug extends in a direction from the multi-plug connector that is approximately 90 degrees from the direction that the second plug extends from the multi-plug connector.

10. A docking station comprising:
    a base; and
    a multi-plug connector rotatably secured to the base so as to allow rotation between a first rotational position and a second rotational position, the multi-plug connector including:
        a first plug designed to plug into a first type of electronic device port;
        a first electrical contact electrically connected to the first plug;
        a second plug designed to plug into a second type of electronic device port; and
        a second electrical contact electrically connected to the second plug;
    wherein the first and second electrical contacts are positioned on the multi-plug connector such that:
        in the first rotational position, the first plug is electrically connected to the base and oriented to plug into a port of an electronic de vice and the second plug is electrically disconnected from the base; and
        in the second rotational position, the first plug is electrically disconnected from the base and the second plug is electrically connected to the base and oriented to plug into a port of an electronic device.

11. The docking station of claim 10, wherein the docking station is to power the electronic device when the electronic device is plugged into the multi-plug connector.

12. The docking station of claim 10, wherein the base includes an electrical contact that electrically mates with the first electrical contact of the multi-plug connector in the first rotational position and electrically mates with the second electrical contact of the multi-plug connector in the second rotational position.

13. The docking station of claim 10, wherein the base is connectable to a cable to power or pass data between the cable and the electronic device through the first or second plug of the multi-plug connector when the electronic device is plugged into the multi-plug connector.

14. The docking station of claim 10, further comprising:
an alignment arm that is adjustable to position an electronic device such that a port of the electronic device is aligned to plug into: (1) the first plug when the multi-plug connector is in the first rotational position, and (2) the second plug when the multi-plug connector is in the second rotational position.

15. A method comprising:
securing a multi-plug connector for a docking station to a base of the docking station such that the multi-plug connector can securely rotate between:

a first secured position in which a first plug is electrically connected to the base and oriented to plug into a first type of electronic device port while a second plug is electrically disconnected from the base and oriented so as not to plug into the electronic device; and a second secured position in which the second plug is electrically connected to the base and oriented to plug into a second type of electronic device port while the first plug is electrically disconnected from the base and oriented so as not to plug into the electronic device; and electrically coupling the multi-plug connector to a cable so as to allow the cable to be electrically coupled to the electronic device when the electronic device is plugged into the multi-plug connector.

\* \* \* \* \*

UNITED STATES PATENT AND TRADEMARK OFFICE
CERTIFICATE OF CORRECTION

PATENT NO.         : 10,034,398 B2
APPLICATION NO.    : 15/326198
DATED              : July 24, 2018
INVENTOR(S)        : Ligy Kurian et al.

It is certified that error appears in the above-identified patent and that said Letters Patent is hereby corrected as shown below:

In the Claims

In Column 9, Line 54, Claim 1, delete "plug," and insert -- plug --, therefor.

In Column 10, Line 33, Claim 8, delete "HIM," and insert -- HDMI, --, therefor.

In Column 10, Line 57, Claim 10, delete "de vice" and insert -- device --, therefor.

Signed and Sealed this
Thirteenth Day of November, 2018

Andrei Iancu
*Director of the United States Patent and Trademark Office*